(12) United States Patent
Koo et al.

(10) Patent No.: US 7,335,919 B2
(45) Date of Patent: Feb. 26, 2008

(54) ACTIVE MATRIX ORGANIC ELECTROLUMINESCENT DISPLAY DEVICE INCLUDING ORGANIC THIN FILM TRANSISTOR AND METHOD OF MANUFACTURING THE DISPLAY DEVICE

(75) Inventors: Jae-Bon Koo, Suwon-si (KR); Min-Chul Suh, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 62 days.

(21) Appl. No.: 11/158,064

(22) Filed: Jun. 22, 2005

(65) Prior Publication Data

US 2005/0285107 A1 Dec. 29, 2005

(30) Foreign Application Priority Data

Jun. 23, 2004 (KR) ........................ 10-2004-0046943

(51) Int. Cl.
*H01L 29/04* (2006.01)
(52) U.S. Cl. .................... 257/72; 257/40; 257/59; 257/83; 257/84; 257/E33.061; 257/E33.064
(58) Field of Classification Search .................. 257/40, 257/114, 292, 99, 79, 103, 59, 72, 83, 84, 257/E33.061, E33.064
See application file for complete search history.

(56) References Cited

U.S. PATENT DOCUMENTS 6,057,896 A * 5/2000 Rho et al. ..................... 349/42
6,483,123 B1 * 11/2002 Kim et al. ..................... 257/40
2002/0041276 A1 * 4/2002 Kimura ...................... 345/204
2002/0158568 A1 * 10/2002 Satake ......................... 313/493
2003/0107326 A1 * 6/2003 Park et al. ................ 315/169.3
2004/0004214 A1 * 1/2004 Yamazaki et al. ............. 257/40
2004/0079945 A1 * 4/2004 Weaver et al. ................ 257/71
2004/0195961 A1 * 10/2004 Lin ............................. 313/504

* cited by examiner

*Primary Examiner*—Minhloan Tran
*Assistant Examiner*—Benjamin Tzu-Hung Liu
(74) *Attorney, Agent, or Firm*—H. C. Park & Associates, PLC

(57) ABSTRACT

Provided is an active matrix organic electroluminescent (EL) display device including an organic thin film transistor (TFT), preferably n-type, having a higher aperture ratio and easily realized in an array structure. The display device includes a facing electrode; an intermediate layer including at least a light emitting layer on the facing electrode; a pixel electrode formed on the intermediate layer; a first electrode located on the pixel electrode and insulated from the pixel electrode; a second electrode located on the pixel electrode and coupled with the pixel electrode; an n-type organic semiconductor layer contacting the first electrode and the second electrode; and a first gate electrode located on the n-type organic semiconductor layer and insulated from the first electrode, the second electrode, and the n-type organic semiconductor layer.

15 Claims, 14 Drawing Sheets

ACTIVE MATRIX ORGANIC ELECTROLUMINESCENT DISPLAY DEVICE INCLUDING ORGANIC THIN FILM TRANSISTOR AND METHOD OF MANUFACTURING THE DISPLAY DEVICE

BACKGROUND OF THE INVENTION

This application claims the priority of Korean Patent Application No. 10-2004-0046943, filed on Jun. 23, 2004, in the Korean Intellectual Property Office, which is hereby incorporated by reference for all purposes as if fully set forth herein.

1. Field of the Invention

The present invention relates to an active matrix organic electroluminescent (EL) display device using an organic thin film transistor (TFT), and more particularly, to an active matrix organic EL display device formed in an array structure, including an n-type organic TFT and having an aperture ratio of approximately 100%.

2. Description of the Related Art

FIG. 1 is a plan view of a sub-pixel unit in a conventional active matrix electroluminescent (EL) display device, and FIG. 2 is a cross-sectional view of the sub-pixel unit of the display device taken along line P1 through P7 of FIG. 1.

Referring to the drawings, in conventional silicon thin film transistors (TFTs) 110 and 150 having a semiconductor layer 180 formed of silicon, the semiconductor layer 180 includes a source region and a drain region, both of which are doped by impurities of high concentration, and a channel region formed between these two regions. In addition, the silicon TFTs 110 and 150 include gate electrodes 111 and 151 insulated from the semiconductor layer 180 and positioned to correspond with the channel region, and source electrodes 112 and 152 and drain electrodes 113 and 153 contacting source regions and the drain regions, respectively.

However, the conventional silicon TFTs 110 and 150 are expensive, fragile, and cannot employ a plastic substrate since they are fabricated at a high temperature, for example, 300° C. or higher.

Flat panel display devices such as liquid crystal displays (LCD) or electroluminescent displays (ELD) use TFTs as switching devices and driving devices for controlling and operating pixels. In order to make flat panel display devices large, thin, and flexible, plastic materials are being considered for the substrate instead of glass. However, when plastic is used, manufacturing is difficult because the display device must be fabricated at a temperature below what is necessary for conventional silicon TFTs.

Since an organic TFT solves the above problems, much research is currently being performed into developing organic TFTs including the organic semiconductor layer.

FIG. 3 is a schematic cross-sectional view of an organic EL display device including the conventional organic TFT. Referring to FIG. 3, an organic EL device 210 and an organic TFT 220 are formed on a substrate 200. The organic EL device 210 includes a transparent electrode 211, an organic light emitting layer 212, and a metal electrode 213, which are sequentially formed on the substrate 200, and the organic TFT 220 includes a gate electrode 221 formed on the substrate 200, a dielectric layer 222 formed on the gate electrode 221, an organic semiconductor layer 223 formed on the dielectric layer 222, and a source electrode 224 and a drain electrode 225 located on both sides of the organic semiconductor layer 223 on the dielectric layer 222. The drain electrode 225 is connected to the transparent electrode 211 and the organic light emitting layer 212 of the organic EL device 210.

However, since the organic EL device 210 is horizontal and parallel to the organic TFT 220, the organic EL device 210 has a low apertureratio due to the size of the organic TFT 220. When the aperture ratio is low, the light emitting intensity of the pixels of the display device needs to be increased, which reduces the lifespan of the display device.

To solve the above problem, Korean Patent Publication No. 2003-0017748 discloses an active matrix organic EL display device, in which an organic TFT and an organic EL device are stacked vertically. FIG. 4 is a cross-sectional view of an organic EL display device including the organic TFT described above.

Referring to FIG. 4, an organic EL device 310 and an organic TFT 330 on a substrate 300 are divided vertically by a first insulating layer 320. The organic EL device 310 includes a transparent electrode 311, an organic light emitting layer 312, and a metal electrode 313, sequentially formed on the substrate 300, and the organic TFT 330 includes a gate electrode 331 formed on the first insulating layer 320, a second insulating layer 332 formed on the gate electrode 331, a source electrode 334 and a drain electrode 335 formed on the second insulating layer 332, and an organic semiconductor layer 333 connected to the source and drain electrodes 334 and 335. In addition, the source electrode 334 is connected to the metal electrode 313.

However, the above example is simply an organic EL device having one organic TFT, not an array of a plurality of organic EL devices having a plurality of organic TFTs. Thus it is difficult to use this single organic EL device to realize an actual useable active matrix organic EL display device including a plurality of organic EL devices.

In addition, in the structure disclosed in the Korean Patent Publication No. 2003-0017748, the organic TFT 330 has an inverted coplanar structure, but in order to realize the active matrix organic EL display device using the organic TFT 330 having such structure, complex processes are required, and the display device becomes more complex.

SUMMARY OF THE INVENTION

The present invention provides an active matrix organic electroluminescent (EL) display device having an organic thin film transistor (TFT), having an aperture ratio of approximately 100%, which is realized by an array.

According to an embodiment of the invention, there is provided an active matrix organic electroluminescent display device having an organic thin film transistor, the display device including a facing electrode, an intermediate layer comprising at least a light emitting layer on the facing electrode, a pixel electrode formed on the intermediate layer, a first electrode provided on the pixel electrode and insulated from the pixel electrode, a second electrode provided on the pixel electrode and connected with the pixel electrode, an n-type organic semiconductor layer contacting the first electrode and the second electrode, and a first gate electrode provided on the n-type organic semiconductor layer and insulated from the first electrode, the second electrode, and the n-type organic semiconductor layer.

According to another embodiment of the invention, there is provided a method of fabricating an active matrix organic electroluminescent display device including an organic thin film transistor, the method including forming a facing electrode on an entire surface of a substrate or in a predetermined pattern, forming an intermediate layer comprising at least a light emitting layer on the facing electrode, forming a pixel electrode of a predetermined pattern on the intermediate layer, forming a protective layer covering the pixel electrode on the entire surface of the substrate, forming a first contact hole in the protective layer to expose the pixel electrode, forming on the protective layer a second electrode connected with the pixel electrode through the first contact hole, a first electrode and a first capacitor electrode integral with each other, a fourth electrode, and a third electrode, forming an n-type organic semiconductor layer covering the electrodes on the entire surface of the substrate, forming a gate insulating layer on the n-type organic semiconductor layer or the entire surface of the substrate, forming a second contact hole in the n-type organic semiconductor layer and the gate insulating layer to expose the fourth electrode, and forming or the gate insulating layer a first gate electrode, a second capacitor electrode connected with the fourth electrode through the second contact hole, and a second gate electrode.

It is to be understood that both the foregoing general description and the following detailed description are exemplary and explanatory and are intended to provide further explanation of the invention as claimed.

BRIEF DESCRIPTION OF THE ILLUSTRATED EMBODIMENTS

The accompanying drawings, which are included to provide a further understanding of the invention and are incorporated in and constitute a part of this specification, illustrate embodiments of the invention and together with the description serve to explain the principles of the invention.

FIG. 15, FIG. 16, FIG. 17, and FIG. 18 are schematic cross-sectional views of stages in the process of fabricating the active matrix organic EL display device including the organic TFT according to the present invention.

DETAILED DESCRIPTION OF THE INVENTION

Figure 1:
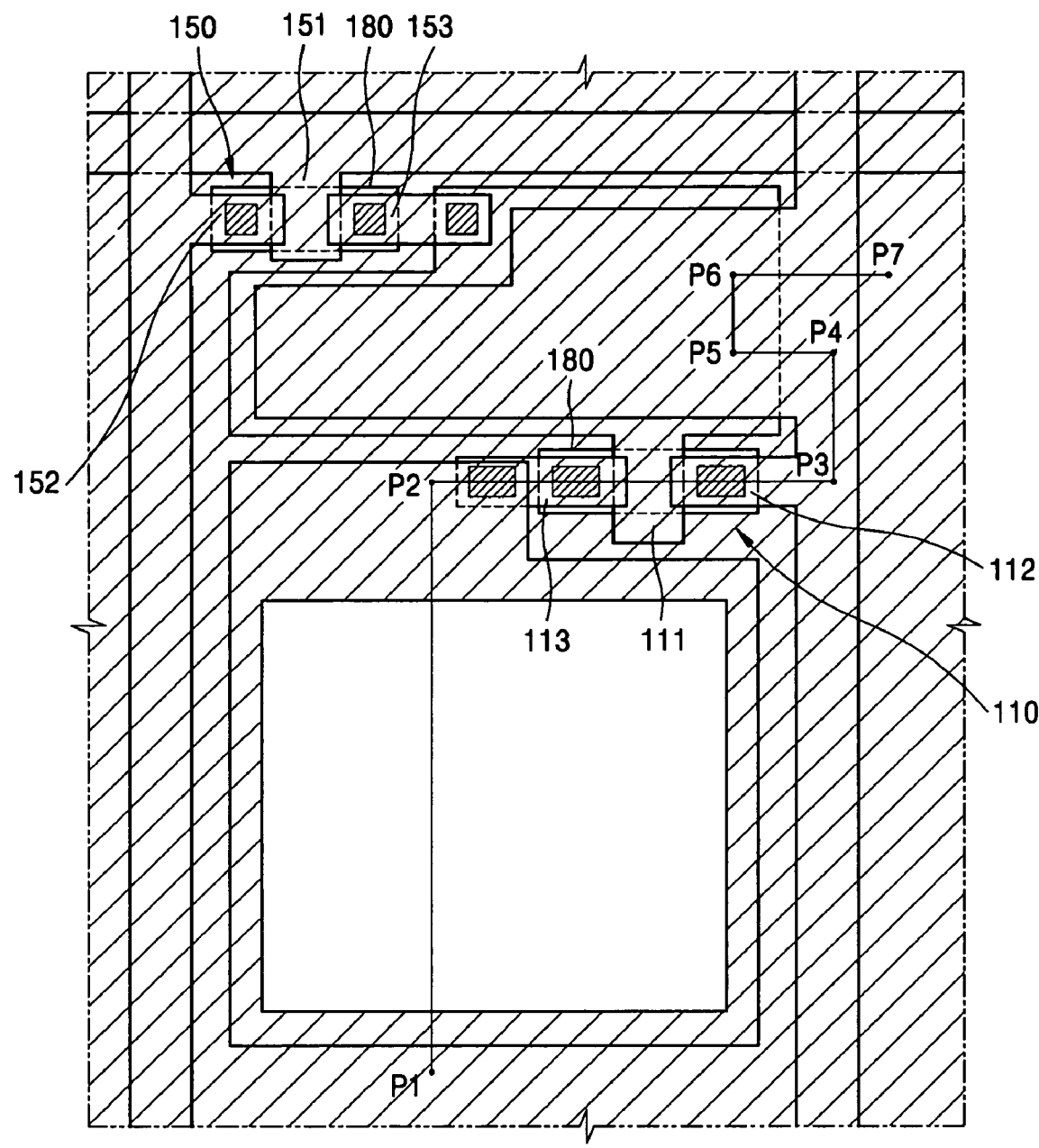
FIG. 1 is a plan view of a sub-pixel unit in a conventional active matrix electroluminescent (EL) display device.
Figure 2:
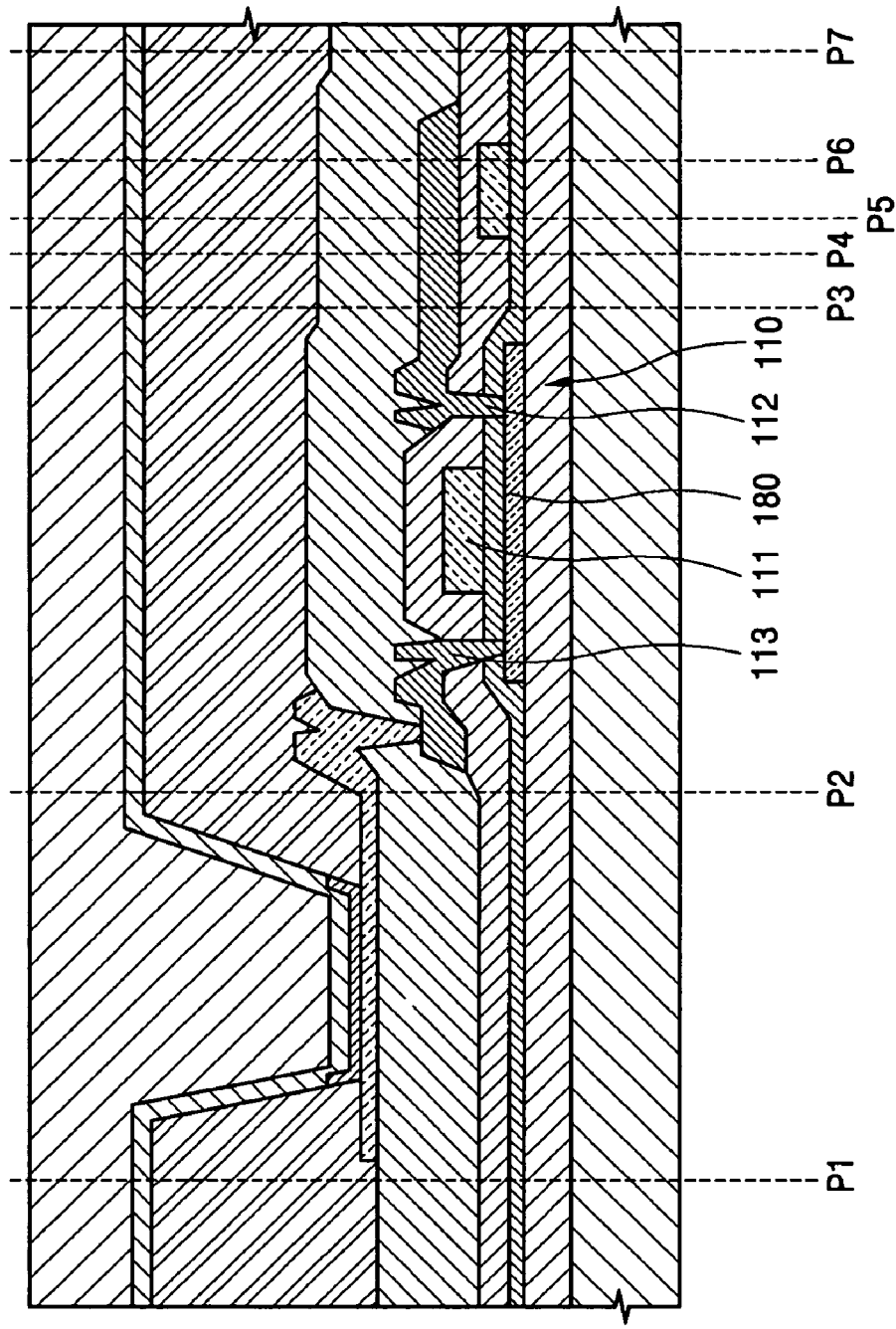
FIG. 2 is a cross-sectional view of the sub-pixel unit of the display device taken along line P1 through P7 of FIG. 1.
Figure 3:
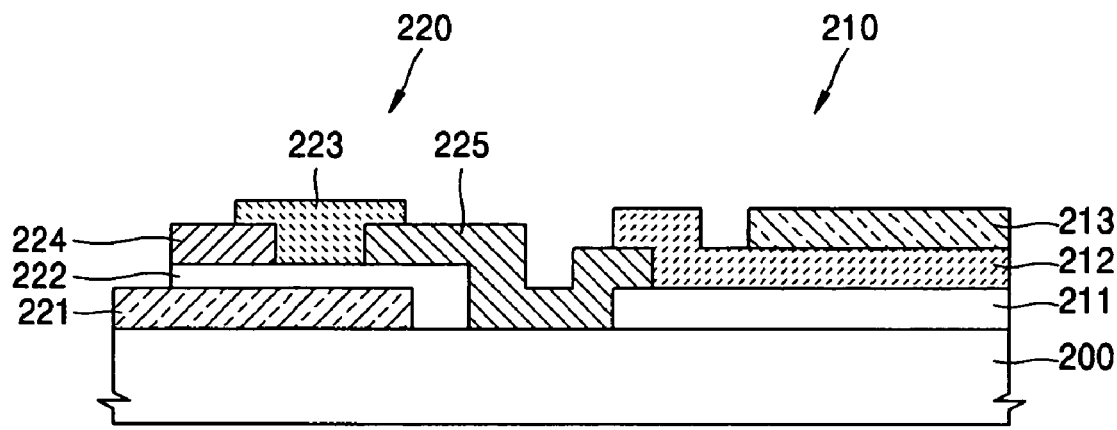
FIG. 3 is a schematic cross-sectional view of an organic EL display device including the conventional thin film transistor (TFT).
Figure 4:
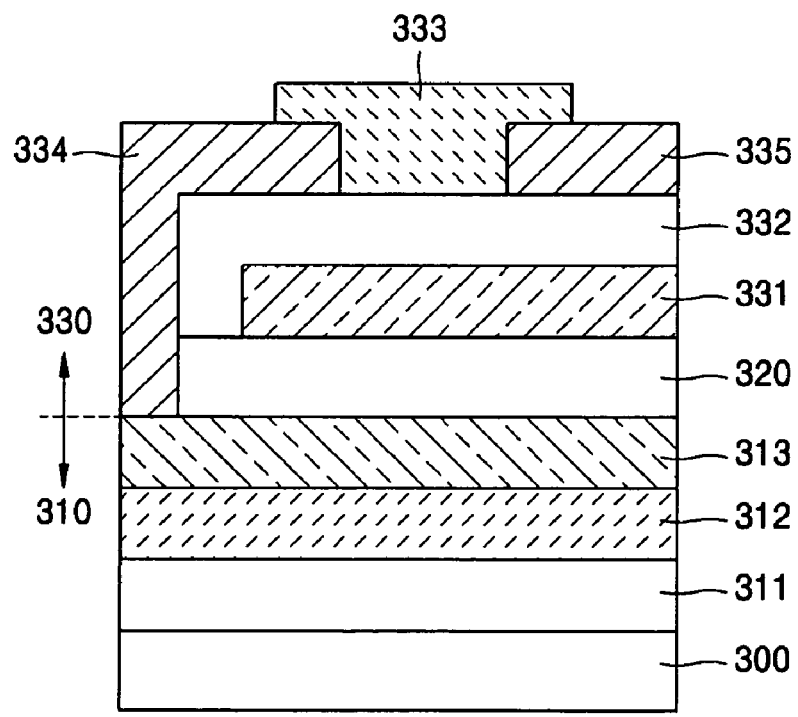
FIG. 4 is a schematic cross-sectional view of an organic EL display device including an organic TFT according to the conventional art.
Figure 5:
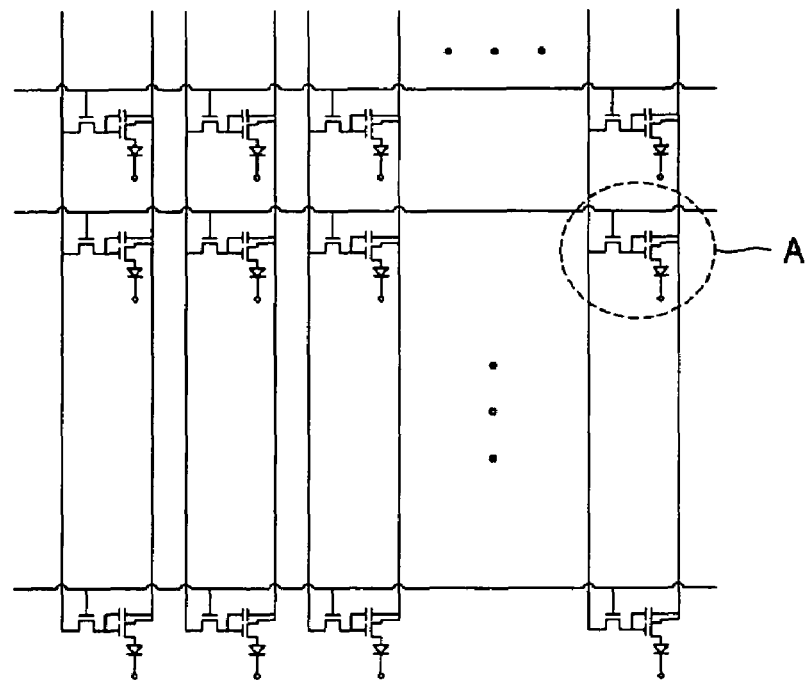
FIG. 5 is a schematic circuit diagram of the circuit of an active matrix EL display device including an n-type organic TFT according to a first embodiment of the invention.
Figure 6:
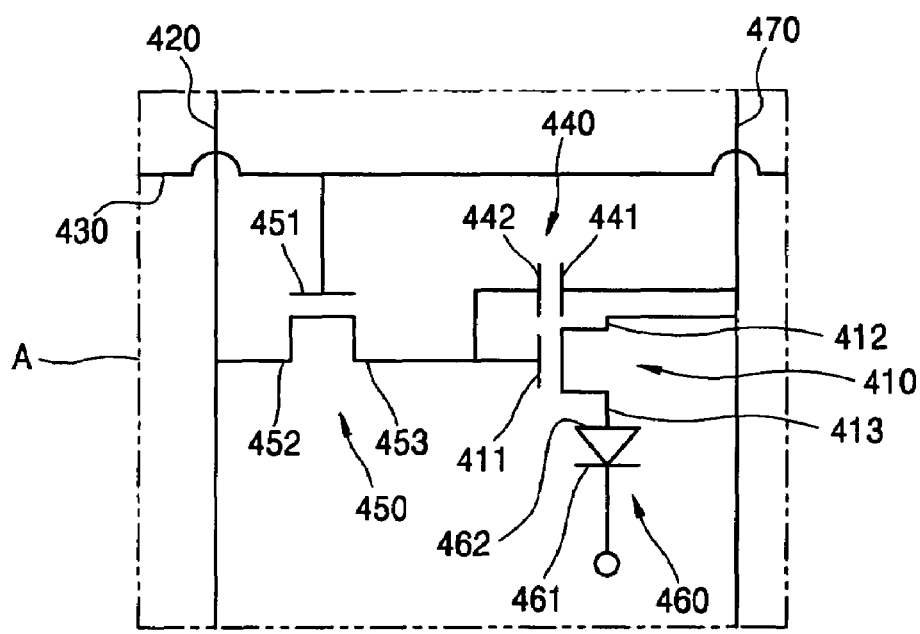
FIG. 6 is a circuit diagram of part "A" of FIG. 5.
Figure 7:
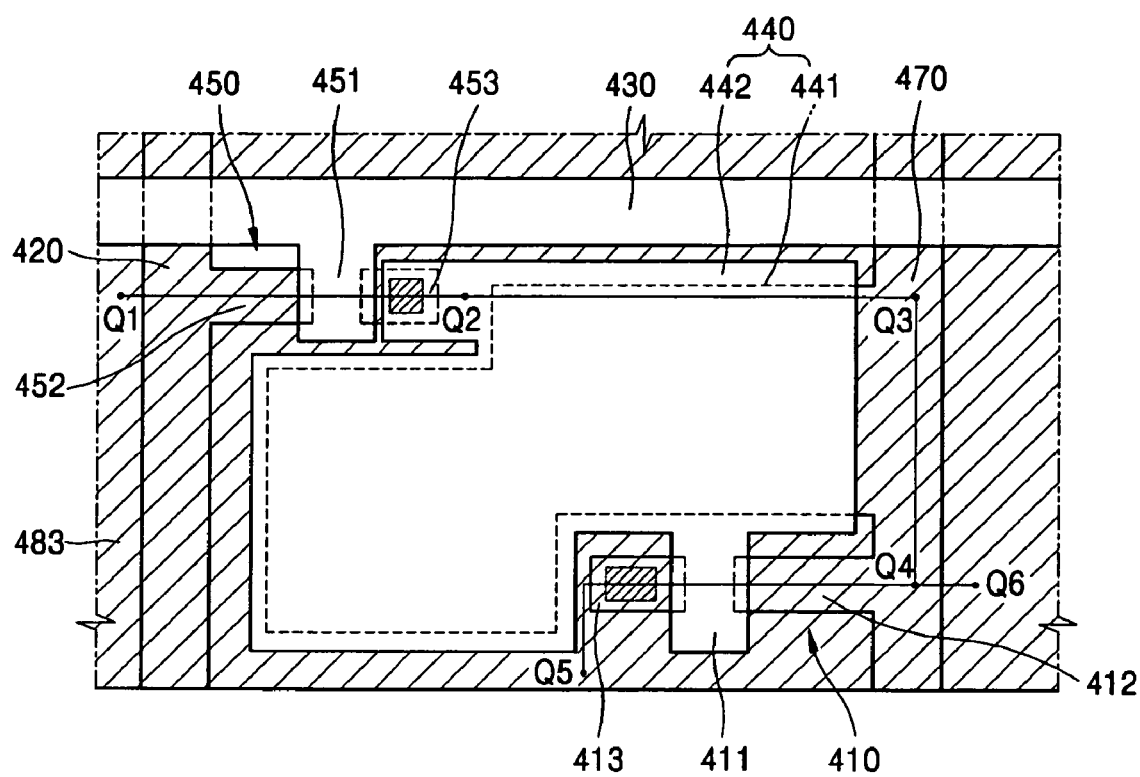
FIG. 7 is a schematic plan view of a sub-pixel unit of the active matrix organic EL display device including the n-type organic TFT.
Figure 8:
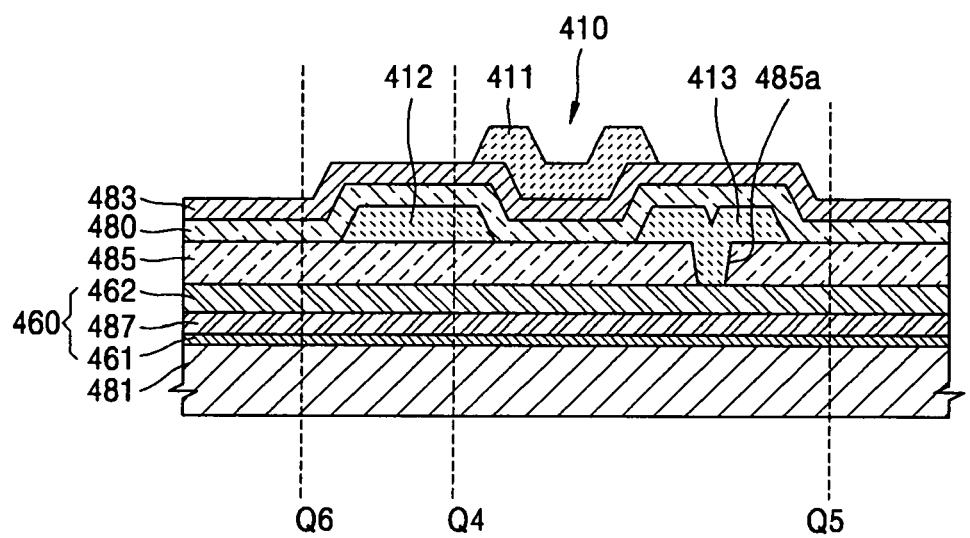
FIG. 8 is a cross-sectional view of the sub-pixel unit of the active matrix organic EL display device including the n-type organic TFT taken along line Q5 and Q6 of FIG. 7.
Figure 9:
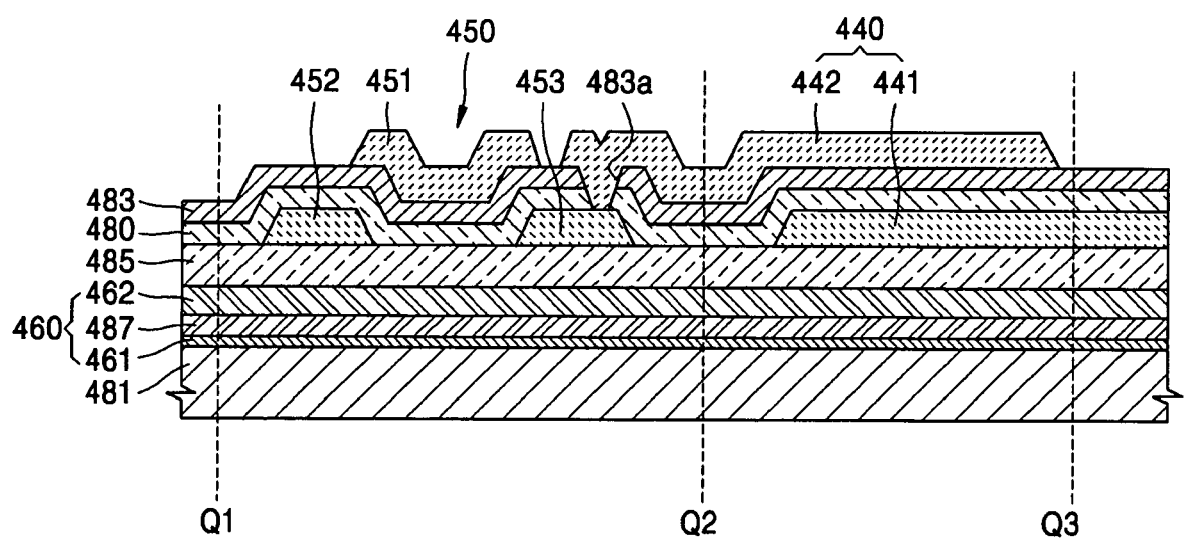
FIG. 9 is a schematic cross-sectional view of the sub-pixel unit of the active matrix organic EL display device including the n-type organic TFT taken along line Q1 through Q3 of FIG. 7.
Figure 10:
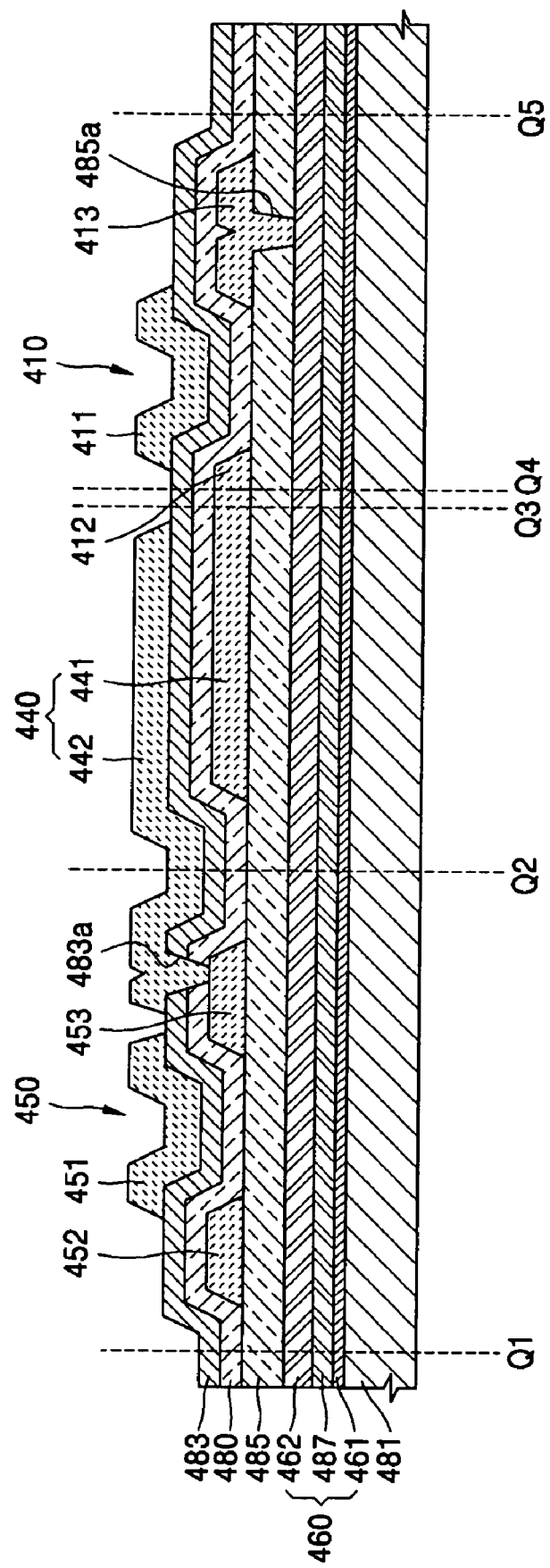
FIG. 10 is a schematic cross-sectional view of the sub-pixel unit of the active matrix organic EL display device including the n-type organic TFT taken along line Q1 through Q5 of FIG. 7.

Referring to a first embodiment of the present invention, FIG. 5 is a schematic circuit diagram of the circuit of an active matrix electroluminescent (EL) display device including an n-type organic thin film transistor (TFT). FIG. 6 is a circuit diagram of part "A" of FIG. 5. FIG. 7 is a schematic plan view of a sub-pixel unit of the active matrix organic EL display device including the n-type organic TFT. FIG. 8 is a cross-sectional view of the sub-pixel unit of the active matrix organic EL display device including the n-type organic TFT taken along line Q5 and Q6. FIG. 9 is a schematic cross-sectional view of the sub-pixel unit of the active matrix organic EL display device including the n-type organic TFT taken along line Q1 through Q3 of FIG. 7. FIG. 10 is a schematic cross-sectional view of the sub-pixel unit of the active matrix organic EL display device including the n-type organic TFT taken along line Q1 through Q5 of FIG. 7.

According to the first embodiment of the invention, but not limited thereto, an EL display device includes various pixel patterns according to the color of emitted light at a light emitting layer. For example, the pixels may each include red, green, and blue sub-pixels. The EL device is a current-driven light emitting device, and emits red, green, or blue light according to the current flowing between two electrodes to display an image.

The EL device includes a facing electrode, an intermediate layer including at least a light emitting layer formed on an upper portion of the facing electrode, and a pixel electrode on the intermediate layer. The present invention is not limited to the above described structure, and various structures of EL device may be applied.

A flat panel display device using the EL device has advantages over conventional display devices, e.g., cathode ray tube, such as superior brightness, higher contrast, wider viewing angle, etc. FIG. 5, FIG. 6, FIG. 7, FIG. 8, FIG. 9, and FIG. 10 illustrate the active matrix EL display device in which a transistor is formed at every pixel to control the light emission of the pixel and/or a signal applied to that pixel. The present invention relates to an organic EL display device having the transistor, that is, for example, an n-type organic TFT.

Referring first to FIG. 5 and FIG. 6, each sub-pixel unit includes a second organic TFT 450 that is driven by a driving circuit, a first organic TFT 410 driven by the second organic TFT 450, and an organic EL device 460 driven by the first organic TFT 410.

A third electrode 452 of the second organic TFT 450 is connected with the driving circuit through a first conducting line 420, a second gate electrode 451 of the second organic TFT 450 is connected with the driving circuit through a second conducting line 430, and a fourth electrode 453 of the second organic TFT 450 with connected to a second capacitor electrode (upper electrode, 442) of a storage capacitor 440 and a first gate electrode 411 of the first organic TFT 410.

In the above structure, the first conducting line 420 may be a data line transmitting data, and the second conducting line 430 may be a scan line. In the embodiment discussed with FIG. 6, the second organic TFT 450 operates as a switching transistor, and the first organic TFT 410 operates as a driving transistor. In the above described selection driving circuit, two or more transistors may be used. Hereinafter, the sub-pixels are described having two transistors, the switching transistor and the driving transistor.

Referring to FIG. 6 and FIG. 7, a first capacitor electrode (lower electrode, 441) of the storage capacitor 440 and a first electrode 412 of the first organic TFT 410 are connected with a third conducting line 470, and a second electrode 413 of the first organic TFT 410 is connected with the pixel electrode 462 of the organic EL device 460. As shown in FIG. 8, FIG. 9, and FIG. 10, the facing electrode 461 of the organic EL device 460 is separated from the pixel electrode 462 by a predetermined gap or distance, and an intermediate layer 487 including at least a light emitting layer is located between the facing and pixel electrodes 461 and 462.

In FIG. 7, the organic TFTs 410 and 450 are provided on a right lower portion and a left upper portion of the sub-pixel unit, and the storage capacitor 440 is provided between the organic TFTs 410 and 450. However, the organic TFTs 410 and 450 can be provided in parallel on the upper or lower portion of the sub-pixel unit, and more organic TFTs can be formed. Further, the organic TFTs 410 and 450 can be provided on a right upper portion and a left lower portion.

FIG. 7, FIG. 8, and FIG. 9 show the physical structure of part "A" shown in FIG. 5 and FIG. 6. FIG. 7 shows the first conducting line 420 and the second conducting line 430 that are not shown in FIG. 8 and FIG. 9. Further FIG. 8 and FIG. 9 show a substrate 481, a gate insulating layer 483, a protective layer 485, and a pixel electrode 462 that are not shown in FIG. 7.

Referring to the drawings, when a scan signal is applied or transmitted to the second gate electrode 451 by the driving circuit, a conductive channel (not shown) is formed on the n-type organic semiconductor layer connecting the third electrode 452 with the fourth electrode 453. For example, when the data signal is supplied to the third electrode 452 by the first conducting line 420, the data signal is transmitted to the storage capacitor 440 and to the first TFT 410. In addition, a conductive channel is formed on the n-type organic semiconductor layer connecting the first electrode 412 and the second electrode 413 and a signal from the third conducting line 470 is transmitted to the pixel electrode 462.

In FIGS. 8, 9, and 10, a detailed structure of the sub-pixel unit is shown. Referring to FIG. 8, the facing electrode 461 is located on the entire upper surface of the substrate 481, the intermediate layer 487 including at least the light emitting layer is formed on the facing electrode 461, and the pixel electrode 462 is located on the intermediate layer 487. The n-type first organic TFT 410 is connected with the organic EL device 460, and the second electrode 413 of the n-type first organic TFT 410 is connected to the pixel electrode 462 of the organic EL device 460. Thus, the pixel electrode 462 becomes a cathode electrode, and the facing electrode 461 corresponding to the pixel electrode 462 becomes an anode electrode. In the following descriptions, organic TFT refers to the n-type organic TFT.

When the organic EL device is a backlight emission type, the substrate 481 and the facing electrode 461 are made of a transparent material, and the pixel electrode 462 is made of a metal having a high light reflectivity.

When the organic EL device is a front emission type, the facing electrode 461 is made of a metal having a high light reflectivity, and the pixel electrode 462, a protective layer 485, an organic semiconductor layer 480, and a gate insulating layer 483 that will be described later may be made of transparent materials. The EL device according to the present invention may be a backlight emission type, a front emission type, or a dual-emission type, that is, the light generated by the EL device may be emitted in at least one direction between the facing and pixel electrodes 461 and 462.

When the facing electrode 461 is formed of the transparent material, the facing electrode 461 can be used as the cathode electrode. Therefore, an auxiliary electrode or a bus electrode line is made of a transparent electrode material, such as indium tin oxide (ITO), indium zinc oxide (IZO), ZnO, $In_2O_3$, or the like, and a metal having a small work function, such as Li, Ca, LiF/Ca, LiF/Al, Al, Ag, Mg, or a compound thereof, is subsequently deposited to form a semi-permeable metal layer, thereby forming the facing electrode 461 having a dual structure. Further, when the facing electrode 461 is a reflective electrode, then Li, Ca, LiF/Ca, LiF/Al, Ag, Mg, or a compound thereof, is deposited on the substrate at a sufficient thickness to form the facing electrode 461.

The facing electrode 461 may cover all the sub-pixels, or may be formed to correspond to each sub-pixel.

When the pixel electrode 462, that is, the anode electrode, is formed of a transparent material, the pixel electrode 462 may be formed of ITO, IZO, ZnO, $In_2O_3$, or the like. When the pixel electrode 462 is a reflective electrode, the electrode is formed of ITO, IZO, ZnO, $In_2O_3$, or the like, and then one of the following: Ag, Mg, Al, Pt, Pd, Au, Ni, Nd, Ir, Cr, or a compound thereof, is deposited thereon at a sufficient thickness to form a low resistance reflective layer. Further, when the pixel electrode 462 is a reflective layer, Au, Ni, Pt, or Pd may be used instead of the above structure. The pattern of the pixel electrode may be formed to correspond to each sub-pixel. However, the shape of the pattern is not limited thereto, and an organic material, such as a conductive polymer, may be used for the facing and pixel electrodes.

The organic EL device 460 includes the pixel electrode 462 which receives a signal from the second electrode 413 of the first organic TFT 410, the facing electrode 461, and the intermediate layer 487 including the light emitting layer, which is located between the pixel electrode 462 and the facing electrode 461. The intermediate layer 487 is made of an organic material.

The organic EL device 460 may have a low-molecular weight organic layer or a polymer organic layer according to the type of organic material.

When the low-molecular weight organic layer is used to form the organic EL device 460, the intermediate layer 487 may include a hole injection layer (HIL), a hole transport layer (HTL), an emission layer (EML), an electron transport layer (ETL), and an electron injection layer (EIL) stacked in a single layer or multiple layer structure. The organic material such as copper phthalocyanine (CuPc), N,N-Di (naphthalene-1-yl)-N,N'-diphenyl-benzidine (NPB) or tris- 8-hydroxyquinoline aluminum (Alq3), may be used. When a charge is supplied to the facing and pixel electrodes, the holes and electrons are combined to generate exitons, and the exitons emit light by dropping from an excited state to a ground state.

As described above, when the pixel electrode 462 is the cathode electrode and the facing electrode 461 is the anode electrode, the intermediate layer 487 may include the HIL, HTL, EML, EIL, and ETL sequentially stacked or formed from the facing electrode 461. It is well know that the intermediate layer 487 may include additional layers.

The low-molecular weight organic layer may be formed by heating and depositing/providing organic material under a vacuum. The structure of the intermediate layer 487 is not limited to the described above example, but may include various layers if necessary.

When the polymer organic layer is used as the intermediate layer 487, the intermediate layer 487 may include the HTL and EML. As described above, when the pixel electrode 462 is the cathode electrode and the facing electrode 461 is the anode electrode, the intermediate layer 487 may include the HTL and EML sequentially stacked or formed from the facing electrode 461.

The polymer HTL may be formed of poly-(2,4)-ehtylene-dihydroxy thiopene (PEDOT) or polyaniline (PANI) by inkjet printing, spin coating or the like. The polymer organic light emitting layer may be made of poly-phenylenevinylene (PPV), soluble PPV, Cyano-PPV, or polyfluorene, and a color pattern can be formed in a general way such as inkjet printing, spin coating, or thermal transfer using a laser. It is understood that the structure of the intermediate layer 487 is not limited to the above embodiment, and various layers may be included.

The protective layer 485 is formed on the organic EL device 460 having the above or substantially similar structure, a first contact hole 485a is formed in the protective layer 485 to expose a portion of the pixel electrode 462, and the second electrode 413 is formed on a predetermined region having the first contact hole 485a. Consequently, the second electrode 413 is coupled with the pixel electrode 462 of the organic EL device 460 through the first contact hole 485a formed in the protective layer 485.

The first organic TFT 410 is formed on the protective layer 485. According to a non-limiting embodiment of the invention, the first organic TFT 410 is an n-type organic TFT.

The structure of the first organic TFT 410 is described below with reference to FIG. 8. Referring to FIG. 8, the first electrode 412 and the second electrode 413 are formed on the protective layer 485. The n-type organic semiconductor layer 480 is formed on the first electrode 412 and on the second electrode 413. The n-type organic semiconductor layer 480 may be made of NTCDA, perylene tetracarboxylic dianhydride (PTCDA), copper hexadecarfluorophthalocyanine ($F_{16}CuPc$), $C_{60}$, pentacene, or PTCDI-C8, by a vacuum deposition technique, a thermal evaporation technique, or the like.

A gate insulating layer 483 is formed on the n-type organic semiconductor layer 480. The gate insulating layer 483 may be made of an organic material, such as PI, parylene, acryl-based polymer (PMMA), epoxy, PS, PE, PP, PTFE, PPS, PC, PET, PVC, BCB, PVP, PAN, PVA, or phenolic resin.

The first gate electrode 411 is formed on the gate insulating layer 483. The first gate electrode 411 may be made of various conductive materials, such as a conductive metal, for example, MoW, Al, Cr, or Al/Cu, or a conductive polymer, by sputtering and photolithography, or by inkjet deposition. A portion of the first gate electrode 411 may overlap with the first electrode 412 and the second electrode 413, as shown in FIG. 8, but is not limited thereto.

As described above, when the organic EL device 460 is formed on the substrate 481 and the first organic TFT 410 is formed on the organic EL device 460, an aperture ratio of approximately 100% can be ensured in the backlight emission type, in which the light generated by the organic EL device 460 emits or travels through the substrate 481. Therefore, since the charge mobility is low in the organic TFT, a large organic TFT may be used in order to increase the on-current. Thus, when the organic TFT is located on the same plane as the organic EL device, the aperture ratio may be reduced. However, when the organic TFT is located on or above the organic EL device, the aperture ratio is not reduced when the size of the organic TFT is increased.

In addition, the organic TFT 410 having a staggered type structure includes the first electrode 412 and the second electrode 413, and the n-type organic semiconductor layer 480, the gate insulating layer 483, and the first gate electrode 411 formed on the gate insulating layer 483. Such structure enables the second electrode 413 of the first organic TFT 410 to be coupled to the pixel electrode 462 of the organic EL device 460. Therefore, since the contact hole 485a is formed in the protective layer 485 located between the organic EL device 460 and the first organic TFT 410, the second electrode 413 and the pixel electrode 462 of the organic EL device 460 can be connected with each other through the contact hole 485a.

The structure of a second organic TFT 450 and a storage capacitor 440 that are connected to the first organic TFT 410 and the organic EL device 460 will be described with reference to FIG. 9.

The structure of the second organic TFT 450 is the same as the structure described above with respect to the first organic TFT 410.

The storage capacitor 440 includes a first capacitor electrode 441 connected to the first electrode 412 of the first organic TFT 410, and a second capacitor electrode 442 facing or parallel with the first capacitor electrode 441 and connected with the fourth electrode 453 of the second organic TFT 450 and the first gate electrode 411 of the first organic TFT 410. The first capacitor electrode 441 may be integrally formed with the first electrode 412, and the second capacitor electrode 442 may be integrally formed with the first gate electrode 411.

The n-type organic semiconductor layer 480 and the gate insulating layer 483 are provided between the first capacitor electrode 441 and the second capacitor electrode 442, and the n-type organic semiconductor layer 480 and the gate insulating layer 483 operate as dielectrics. In addition, the second capacitor electrode 442 is connected with the fourth electrode 453 of the second organic TFT 450 through a second contact hole 483a formed in the n-type semiconductor layer 480 and the gate insulating layer 483.

The storage capacitor 440 having the above structure operates to maintain the electric current flowing to the pixel electrode 462, or increase the driving speed of the pixel electrode 462.

FIG. 10 is a schematic cross-sectional view of the first organic TFT 410, the storage capacitor 440, and the second organic TFT 450, of the sub-pixel unit, which is taken along line Q1 through Q5 of FIG. 7, in the active matrix organic EL display device including the organic TFT according to an embodiment of the invention.

Referring to FIG. 10, the first electrode 412 and the second electrode 413 of the first organic TFT 410, the first capacitor electrode 441 of the storage capacitor 440, and the third electrode 452 and the fourth electrode 453 of the second organic TFT 450 are each formed on the same plane. Also, the first gate electrode 411 of the first organic TFT 410, the second capacitor electrode 442 of the storage capacitor 440, and the second gate electrode 451 of the second organic TFT 450 are each formed on the same plane.

The above described structures of the first organic TFT 410, the storage capacitor 440, and the second organic TFT 450 simplifies the manufacturing of the active matrix organic EL display. In addition, referring to FIG. 10, since the organic EL device 460 is formed under or below the organic TFTs and the storage capacitor, an aperture ratio of approximately 100% can be provided in the backlight emission type, wherein the light generated by the organic EL device 460 emits or travels through the substrate 481.

Since the organic TFT may be manufactured by a low-temperature process that does not affect the organic EL device 460 and the substrate 481, the organic EL display device can be used. The facing electrode 461 of the organic EL device 460 is a transparent electrode, and the pixel electrode 462 is a reflective electrode.

Figure 11:
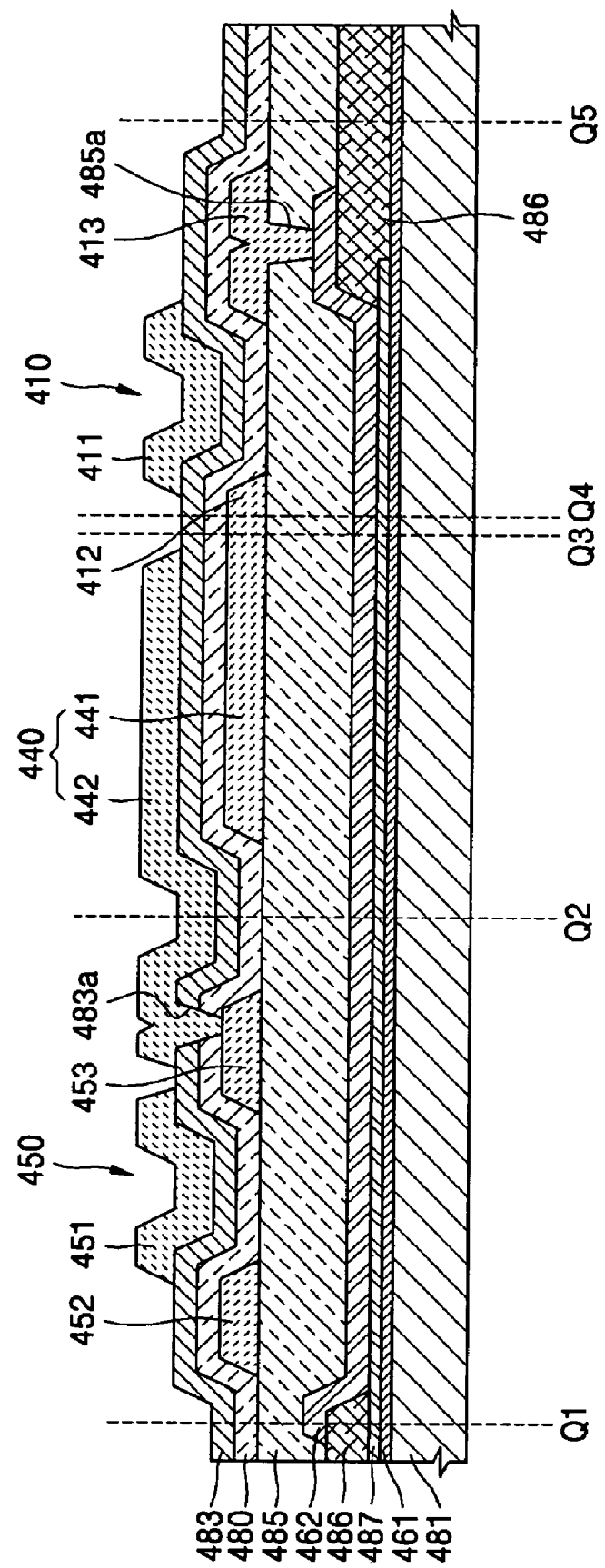
FIG. 11 is a cross-sectional view of a sub-pixel unit in an active matrix organic EL display device including an n-type organic TFT according to a second embodiment of the invention.

FIG. 11 is a cross-sectional view of a sub-pixel unit in an active matrix organic EL display device including an organic TFT according to a second embodiment of the invention.

Referring to FIG. 11, the organic EL device includes the facing electrode 461 provided on the substrate 481, the intermediate layer 487 including the light emitting layer, and the pixel electrode 462. In addition, two staggered structure n-type organic TFTs 410 and 450 and a storage capacitor 440 are formed on the organic EL device. The second electrode 413 of the first organic TFT between the two n-type organic TFTs 410 and 450 is coupled with the pixel electrode 462 of the organic EL device. The above described structure is the same as the structure of the first embodiment, except that a pixel definition layer 486 is formed on the facing electrode 461. The pixel definition layer 486 divides or separates the sub-pixels formed of the organic EL devices.

The pixel definition layer 486 increases a gap located between an edge of the pixel electrode 462 and the facing electrode 461 in each sub-pixel and defines the light emitting region between the sub-pixels on the first electrode 461. Thus, the pixel definition layer 486 prevents the electric field from being concentrated at the edge of the pixel electrode 462, thereby preventing short circuits from occurring between the facing electrode 461 and the pixel electrodes 462.

Figure 12:
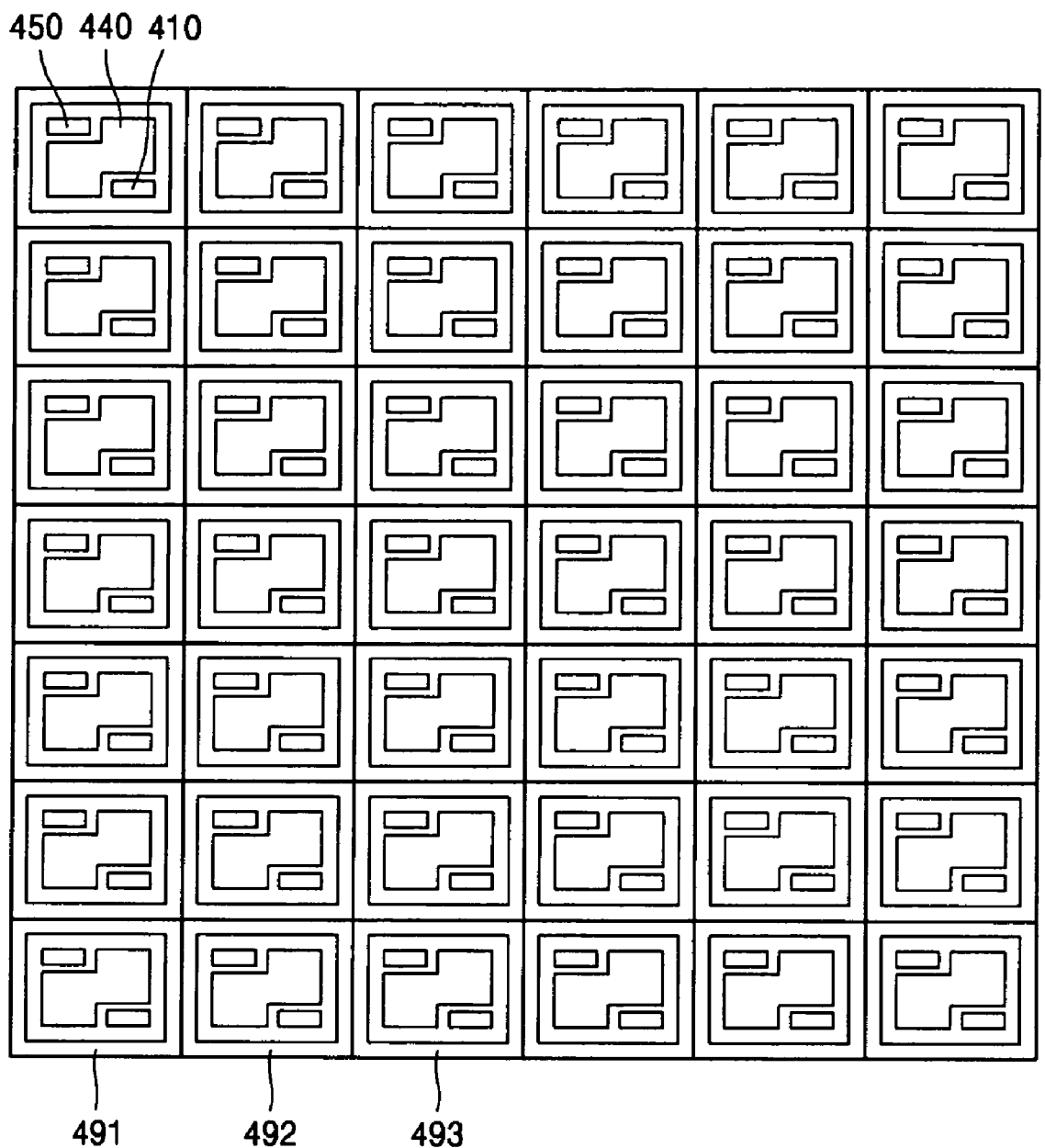
FIG. 12 is a schematic plan view of part of the sub-pixel units in the active matrix organic EL display device including the n-type organic TFT according to a third embodiment of the invention.

FIG. 12 is a schematic plan view of portion of the sub-pixel units in the active matrix organic EL display device including the organic TFT according to a third embodiment of the invention.

As described above with respect to the first and second embodiments of the invention, the organic EL display device includes various pixel patterns according to the color of light emitted by the light emitting layer. For example, the pixels may each include red, green, and blue sub-pixels. Thus, the organic EL device is a current-driven light emitting device, and emits red, green, or blue light according to the current flowing between two electrodes to display a predetermined image. The colors may be generated by making the light emitting layer of the intermediate layer in the organic EL device emit red 491, green 492, or blue 493 light as shown in FIG. 12. The arrangement, order and position of the sub-pixels are not limited to the example shown in FIG. 12. For example, the sub-pixels may be arranged in stripes, mosaic, or delta arrangements. In addition, the structures of organic TFTs 410 and 450 and the storage capacitor 440 in the each sub-pixel unit are not limited to the examples shown in FIG. 12.

The sub-pixel 491 having the red light emitting layer may be made of poly(1,4-phenylenevinylene) derivative, Nile red, 4-(dicyanomethyelene)-2-methyl-6-(julolidine-4-yl-vinyl)-4H-pyran (dcm2), 2,3,7,8,12,13,17,18-octaethyl, 21H,23H-porphine platinum (II) (PEOEP), or 4-(dicyanomethylene)-2-tertbutyl-6-(1,1,7,7-tetramethyl julolidyl-9-enyl)-4H-pyran.

The sub-pixel 492 having the green light emitting layer may be made of 10-(2-benzothiazolyl)-2,3,6,7-tetrahydro-1,1,7,7-tetramethyl-1H,5H,11H-[1]benzopyrano[6,7,8-ij]quinolizine (C545T), tri(8-hydroxyquinolato)aluminum (Alq3), or tris(2-(2-pyridylphenyl)-C,N))iridium(II) (Ir)ppy.

The sub-pixel 493 having the blue light emitting layer may be made of fluorene-based polymer, spirofluorene-based polymer, carbazole-based low molecular weight such as dicarbazole stilbene (DCS) (also referred to as bis[carbazole-(9)]-stilbene, or 4,4'-bis(2,2'-diphenylenethen-1-yl)-N,N'-bis (phenyl)benzidine (a-NPD).

Figure 13:
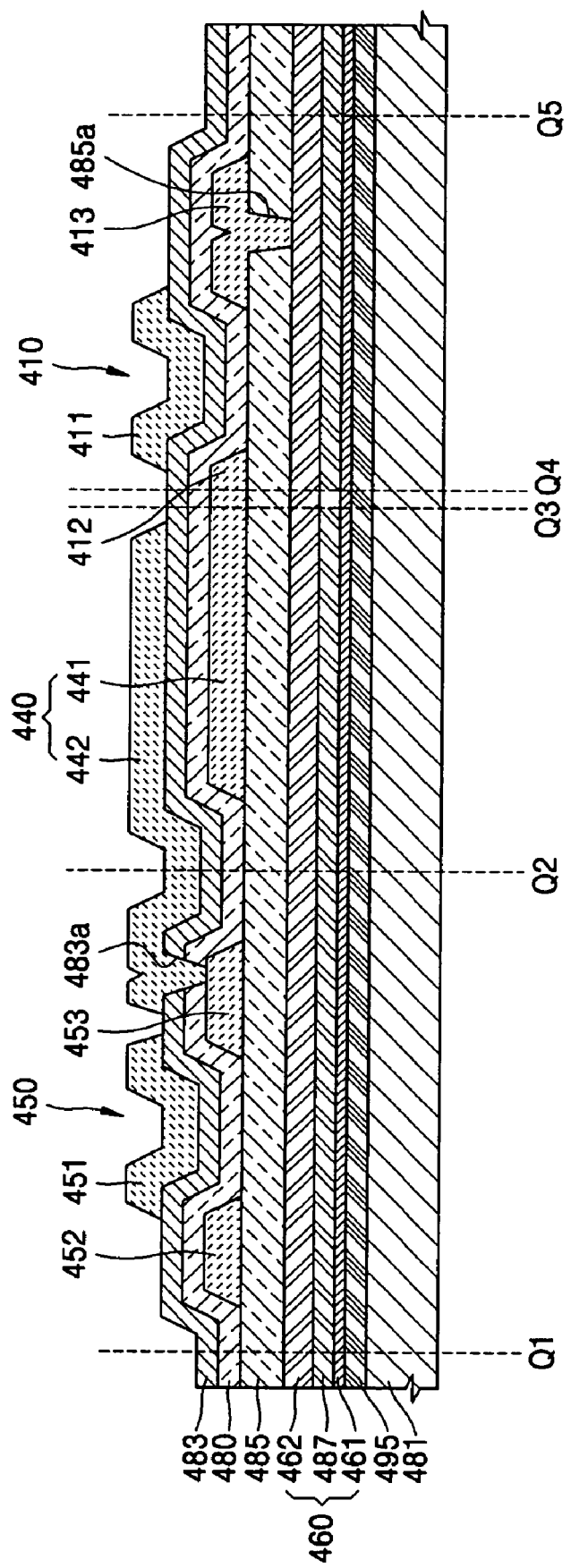
FIG. 13 is a schematic cross-sectional view of a sub-pixel unit of the active matrix organic EL display device including an n-type organic TFT according to a fourth embodiment of the invention.

FIG. 13 is a schematic cross-sectional view of a sub-pixel unit of the active matrix organic EL display device including an organic TFT according to a fourth embodiment of the invention. Referring to FIG. 13, an organic EL device including the facing electrode 461, the intermediate layer 487 including the light emitting layer, and the pixel electrode 462 is located on the substrate 481, and two staggered type n-type organic TFTs 410 and 450 and the storage capacitor 440 are formed on the organic EL device. In addition, the second electrode 413 of the first organic TFT 410 is coupled with the pixel electrode 462 of the organic EL device. The above structure is the same as those of the above described embodiments of the invention, except that the structure is different from the third embodiment because the structure of the fourth embodiment includes a color filter 495 located between the substrate 481 and the facing electrode 461.

That is, the organic EL display device of the third embodiment includes a light emitting layer that is made materials emitting red, green, and blue light to display a full-color image. However, in the organic EL display device according to the fourth embodiment, the light emitting layer emits white light, which passes through the color filter 495, to produce red, green, or blue light. For example, the spectrum of the white light may include all visible wavelengths, or may have peaks corresponding to red, green, and blue light.

Figure 14:
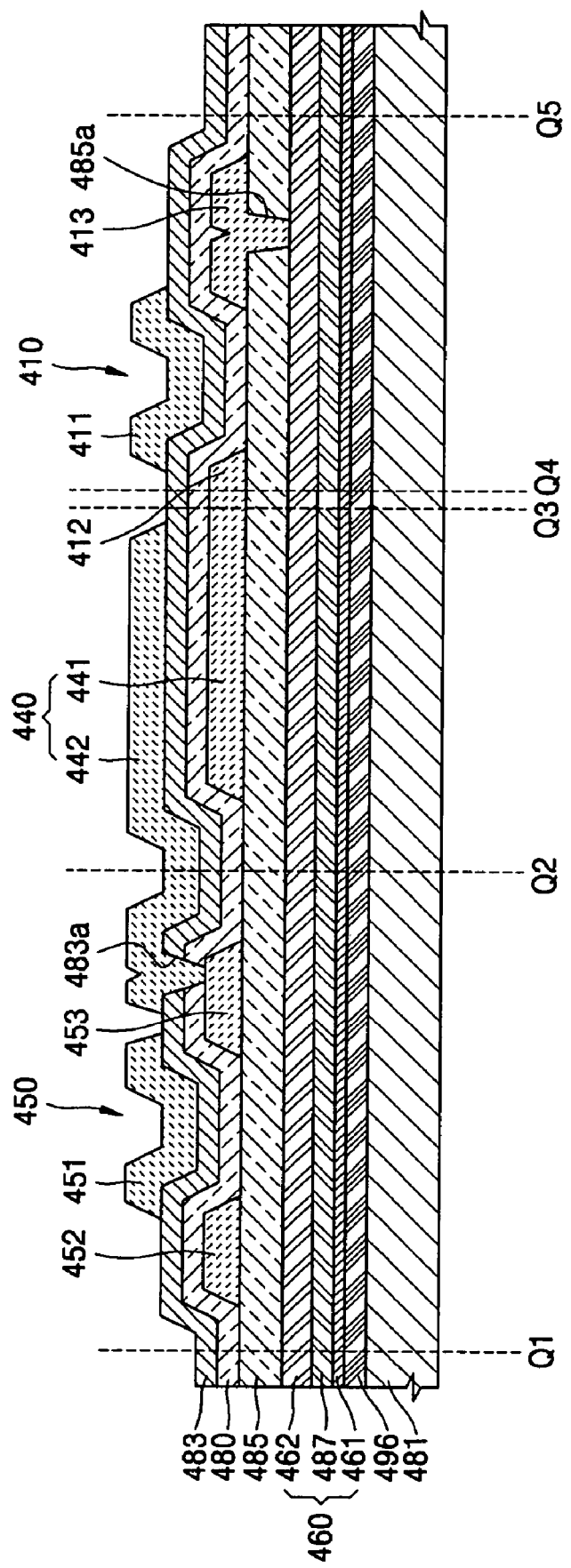
FIG. 14 is a schematic cross-sectional view of a sub-pixel unit in the active matrix organic EL display device including an n-type organic TFT according to a fifth embodiment of the invention.

FIG. 14 is a schematic cross-sectional view of a sub-pixel unit in the active matrix organic EL display device including an organic TFT according to a fifth embodiment of the invention. Referring to FIG. 14, an organic EL device including the facing electrode 461, the intermediate layer 487 including the light emitting layer, and the pixel electrode 462 is located on the substrate 481, and two staggered structure type n-type organic TFTs 410 and 450 and the storage capacitor 440 are formed on the organic EL device. In addition, the second electrode 413 of the first organic TFT 410 is connected with the pixel electrode 462 of the organic EL device. The above structure is the same as those of the above embodiments, except that the above structure includes a color conversion layer 496 located between the substrate 481 and the first electrode 461.

The organic EL display device of the third embodiment includes a light emitting layer that is made of materials emitting red, green, and blue light. The organic EL display device of the fourth embodiment includes a layer emitting white light that passes through the color filter, which produces red, green, and blue light. However, in the organic EL display device according to the fifth embodiment, the light emitting layer emits blue light, which is converted into red, green, and blue light by the color conversion layer 496, thereby displaying a predetermined full-color image.

FIG. 15, FIG. 16, FIG. 17, and FIG. 18 are schematic cross-sectional views of stages in the process of fabricating the active matrix organic EL display device including the organic TFT according to the invention.

Figure 15:
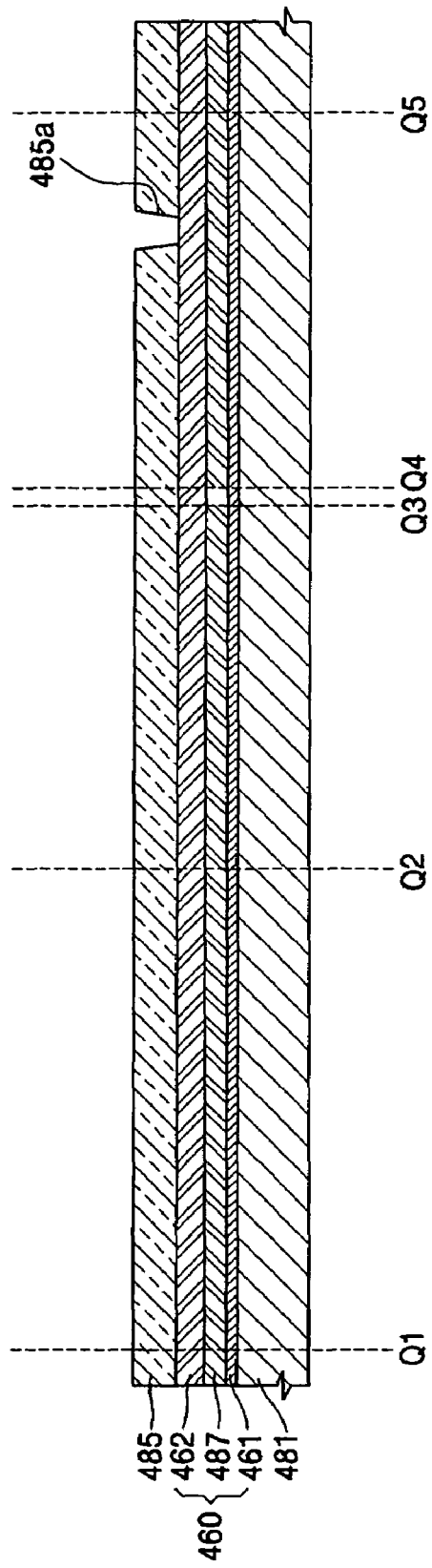

Referring to FIG. 15, the facing electrode 461 is formed on the entire surface of the substrate 481 or in each sub-pixel on the substrate 481, and the intermediate layer 487 having the light emitting layer is formed on the facing electrode by one of several techniques, such as inkjet printing, spin coating, or thermal transfer. The pixel electrode 462 is then formed in each sub-pixel region on the intermediate layer 487. In addition, after forming the protective layer 485 on the pixel electrode 462, the first contact hole 485a exposing part of the pixel electrode 462 is formed in the protective layer 485 of the each sub-pixel. The first contact hole 485a can be formed by any of several techniques, such as a laser ablation technique (LAT), using a laser.

Figure 16:
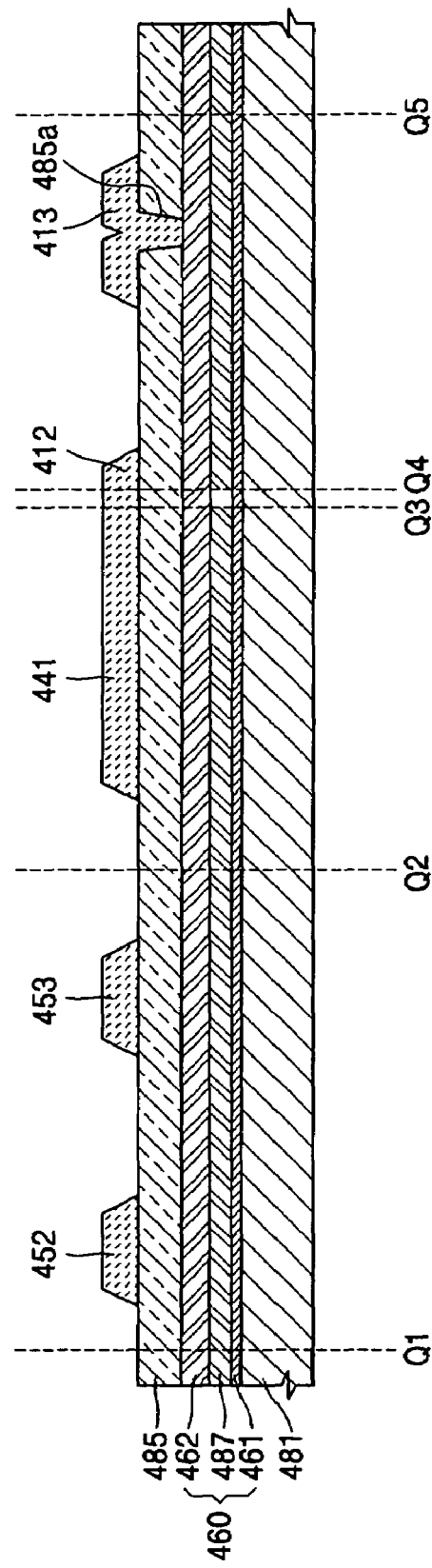

After performing the above process, the second electrode 413 coupled with the pixel electrode 462 through the first contact hole 485a, the first electrode 412 and the first capacitor electrode 441 are integrally formed with each other, the fourth electrode 453, and the third electrode 452 are formed as shown in FIG. 16. The second electrode 413, the first electrode 412, the first capacitor electrode 441, the fourth electrode 453, and the third electrode 452 can be formed by patterning in a deposition method using a shadow mask, or by inkjet printing.

Figure 17:
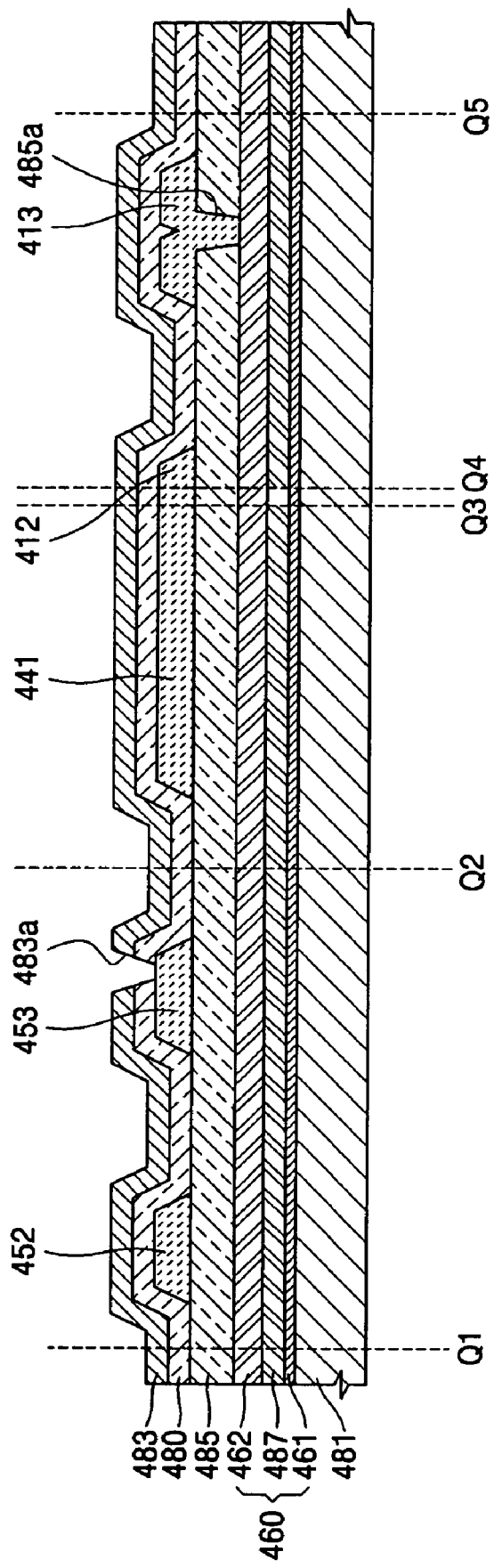

After forming the second electrode 413, the first electrode 412, the first capacitor electrode 441, the fourth electrode 453, and the source electrode 452, the n-type organic semiconductor layer 480 covering the above electrodes is formed on the entire surface of the substrate 481 by vacuum deposition or thermal evaporation as shown in FIG. 17. In addition, the gate insulating layer 483 is formed on the entire n-type organic semiconductor layer 480 by, for example, a spin coating technique, and the second contact hole 483a is formed in the n-type organic semiconductor layer 480 and the gate insulating layer 483 to expose the fourth electrode 453. The second contact hole 483a may be formed by LAT, using a laser.

Figure 18:
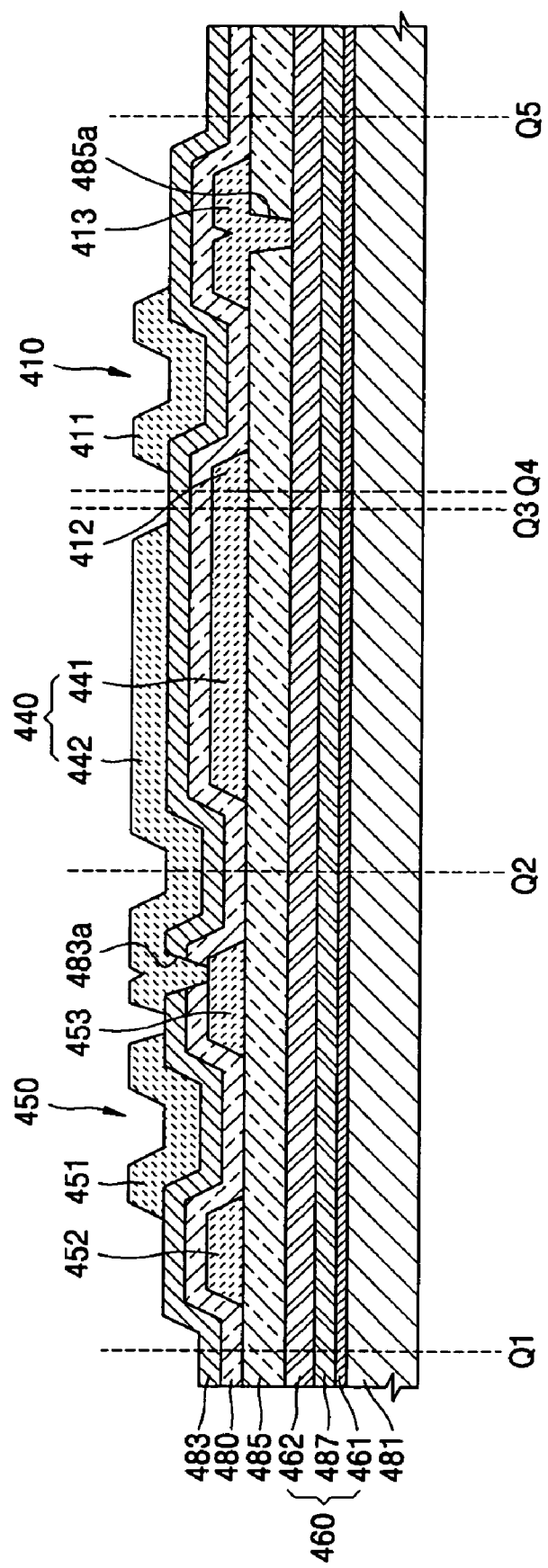

The first gate electrode 411 and second gate electrode 451 formed on the gate insulating layer 483, and the second capacitor electrode 442 connected to the fourth electrode 453 through the second contact hole 483a and formed on the first capacitor electrode 441 are fabricated by patterning in a deposition method using the shadow mask or by inkjet printing. Thus, the organic EL display device including the n-type organic TFT and the storage capacitor may be fabricated as shown in FIG. 18. Additionally, a sealing member and a front substrate may be formed on the organic EL devices and the organic TFTs fabricated according to the above described processes.

The organic EL display devices having the n-type organic TFT and the storage capacitor may be mass-produced through the above processes because all processes after forming the organic EL device 460 may be performed by evaporation or spin coating. In other words, to produce the organic TFT located on the organic EL device, the metal electrodes may be formed by a deposition patterning process using a shadow mask, the n-type organic semiconductor layer 480 can be formed by a spin coating technique or a deposition technique, and the gate insulating layer may be formed by the spin coating technique using the organic material. Therefore, the organic EL display device having the above described structure may be fabricated without damaging the organic EL device located under or below the display device.

Additionally, a process of forming the pixel definition layer may be performed added between the process of forming the facing electrode 461 and the process of forming of the intermediate layer 487. In this case, after forming the facing electrode 461, the material for the pixel definition layer is applied on the facing electrode 461 over the entire substrate 481, and then the material is patterned by a patterning technique, such as photolithography, and baked or heat treated. Since the organic elements are not yet formed, high temperatures may be used to fabricate the pixel definition layer of the organic EL display device.

Additionally, the color filter that filters white light into red, green, and blue light may be formed on the substrate 481 before the processes of forming the light emitting layer included in the intermediate layer 487 and forming the facing electrode 461. Alternatively, the color conversion layer that converts the blue light into red, green, and blue light may be formed on the substrate 481 before the processes of forming the light emitting layer and forming the facing electrode 461.

The following are some of the benefits obtained from the organic EL display device including the organic TFTs and the method of fabricating the display device thereof.

An aperture ratio of 100% is obtainable since the n-type organic TFT is formed on the organic EL device.

The current applied to the organic EL device can be reduced while maintaining a given brightness, thereby reducing the power consumption and increasing the lifespan of the organic EL device, since the aperture ratio is approximately 100%.

Further, increasing the size of the organic TFT increases the on-current of the organic TFT. Since the organic TFT is located on an upper portion of the organic EL device, a sufficiently large organic TFT may be formed without reducing the aperture rate.

In addition, since the organic TFT is formed as a staggered structure type, the structure can be simplified.

Thus, since the active matrix organic EL device may be easily realized in an array structure, fabrication costs can be reduced by mass-producing the devices.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An active matrix organic electroluminescent display device having an organic thin film transistor, the display device comprising:
   a facing electrode;
   an intermediate layer on the facing electrode and comprising a light emitting layer;
   a pixel electrode formed on the intermediate layer;
   a first electrode provided on an insulating layer to insulate the first electrode from the pixel electrode;
   a second electrode provided on the pixel electrode and coupled with the pixel electrode;
   an n-type organic semiconductor layer contacting the first electrode and the second electrode; and a first gate electrode provided on the n-type organic semiconductor layer and insulated from the first electrode, the second electrode, and the n-type organic semiconductor layer.

2. The display device of claim 1, wherein a protective layer is provided on the pixel electrode, the first electrode and the second electrode are provided on the protective layer, and the second electrode is coupled with the pixel electrode through a contact hole provided in the protective layer.

3. The display device of claim 1, wherein a gate insulating layer is provided on the n-type organic semiconductor layer, and the first gate electrode is provided on the gate insulating layer.

4. The display device of claim 3, wherein the gate insulating layer is made of an organic material.

5. The display device of claim 1, further comprising: a capacitor comprising:
   a first capacitor electrode coupled with the first electrode, and a second capacitor electrode facing the first capacitor electrode and coupled with the first gate electrode;
   a fourth electrode coupled with the second capacitor electrode; an organic semiconductor layer contacting the fourth electrode;
   a third electrode contacting the organic semiconductor layer; and
   a second gate electrode insulated from the fourth electrode, the third electrode, and the organic semiconductor layer.

6. The display device of claim 5, wherein the second electrode, the first electrode, the first capacitor electrode, the fourth electrode, and the third electrode are located on the same plane, and
   wherein the first gate electrode, the second capacitor electrode, and the second gate electrode are located on the same plane.

7. The display device of claim 1, wherein the facing electrode is a transparent electrode, and
   wherein the pixel electrode is a reflective electrode.

8. The display device of claim 1, further comprising: a pixel definition layer on the facing electrode.

9. The display device of claim 1, wherein the light emitting layer included in the intermediate layer emits red, green, and blue light.

10. The display device of claim 1, further comprising:
    a color filter that filters white light into red, green, and blue light,
    wherein the light emitting layer emits white light.

11. The display device of claim 1, further comprising:
    a color conversion layer that converts blue light into red, green, and blue light,
    wherein the light emitting layer emits a blue light.

12. A method of fabricating an active matrix organic electroluminescent display device including an organic thin film transistor, the method comprising:
    forming a facing electrode on an entire surface of a substrate or in a predetermined pattern;
    forming an intermediate layer comprising at least a light emitting layer on the facing electrode;
    forming a pixel electrode of a predetermined pattern on the intermediate layer;
    forming a protective layer covering the pixel electrode on the entire surface of the substrate;
    forming a first contact hole in the protective layer to expose the pixel electrode;
    forming a second electrode coupled with the pixel electrode through the first contact hole, a first electrode and a first capacitor electrode integral with each other, a fourth electrode, and a third electrode on the protective layer;
    forming an n-type organic semiconductor layer to cover the electrodes;
    forming a gate insulating layer on the n-type organic semiconductor layer;
    forming a second contact hole in the n-type organic semiconductor layer and the gate insulating layer to expose the fourth electrode; and
    forming on the gate insulating layer a first gate electrode, a second capacitor electrode coupled with the fourth electrode through the second contact hole, and a second gate electrode.

13. The method of claim 12, further comprising:
    forming a pixel definition layer on the facing electrode.

14. The method of claim 12, further comprising forming a color filter, which filters white light into red, green, and blue light, on the substrate before forming the facing electrode, wherein the light emitting layer emits white light.

15. The method of claim 12, further comprising forming a color conversion layer, which converts blue light into red, green, and blue light, on the substrate before forming the facing electrode, wherein the light emitting layer emits blue light.

* * * * *